United States Patent [19]

Edmonds et al.

[11] 4,144,099

[45] Mar. 13, 1979

[54] HIGH PERFORMANCE SILICON WAFER AND FABRICATION PROCESS

[75] Inventors: Harold D. Edmonds, Hopewell Junction; Gary Markovits, Poughkeepsie, both of N.Y.

[73] Assignee: International Business Machines Corporation, Armonk, N.Y.

[21] Appl. No.: 847,383

[22] Filed: Oct. 31, 1977

[51] Int. Cl.² .................. H01L 21/322; H01L 21/324
[52] U.S. Cl. ..................................... 148/1.5; 148/33; 148/175; 156/645
[58] Field of Search ............... 156/645; 148/1.5, 175, 148/188, 33.2; 29/590

[56] References Cited

U.S. PATENT DOCUMENTS

| | | | |
|---|---|---|---|
| 3,579,815 | 5/1971 | Gentry | 29/580 |
| 3,701,696 | 10/1972 | Mets | 148/175 |
| 3,723,053 | 3/1973 | Myers et al. | 432/6 |
| 3,856,472 | 12/1974 | Schweitzer et al. | 23/252 |
| 3,874,936 | 4/1975 | d'Hervilly et al. | 148/1.5 |
| 3,905,162 | 9/1975 | Lawrence | 51/281 SF |
| 3,923,567 | 12/1975 | Lawrence | 156/7 |
| 3,929,529 | 12/1975 | Poponiak | 148/191 |
| 3,997,368 | 12/1976 | Petroff et al. | 148/1.5 |
| 4,018,626 | 4/1977 | Schwuttle et al. | 148/1.5 |
| 4,042,419 | 8/1977 | Heinke | 148/1.5 |
| 4,069,068 | 6/1978 | Beyer et al. | 148/1.5 |

OTHER PUBLICATIONS

Poponiak et al., "Gettering Technique . . . Device," IBM-TDB, 16 (1973) 1063.
Poponiak et al., "Gettering—Implant Damage . . . Layer" IBM-TDB, 19 (1976) 2052.
Beyer et al., "Gettering & Barrier Technique" IBM-TDB, 19 (1976) 2050.
Pomerantz, ". . . S.F. in Si Epi-Layers" Jour. Appl. Phys. 38 (1967) 5020.
Tash et al., "Plastic Defor. & MOS . . . ", Semiconductor Si ed. H. R. Huff et al. The Electrochem. Soc. Symp. 1973, p. 658.
Nakamura et al., . . . Gettering . . . in Si Jap. Jour. Appl. Phys. 7 (1968) 512.

*Primary Examiner*—L. Dewayne Rutledge
*Assistant Examiner*—Upendra Roy
*Attorney, Agent, or Firm*—David M. Bunnell

[57] ABSTRACT

Gettered semiconductor wafers for integrated circuit device manufacture are prepared by grinding a layer of damage into the back face of the wafer to a depth of about 8–35 microns, heating the wafer to a temperature of about 800°–1150° C. for about 1 to 3 hours and quickly cooling the wafer to a temperature below about 600° C., and polishing both sides of the wafer to form a polished, substantially damage-free front face and a smooth back face which has a residual layer of crystallographic damage to provide additional gettering during device manufacture.

12 Claims, 2 Drawing Figures

HIGH PERFORMANCE SILICON WAFER AND FABRICATION PROCESS

BACKGROUND OF THE INVENTION

A number of processes have been disclosed to provide gettering in semiconductor materials, such as silicon wafers, so that the yield of integrated circuit devices obtained from the materials is increased. These processes include the mechanical introduction of damage to the back side of the semiconductor materials. The damage has been introduced either before or during the device formation process. As the density of devices formed on a given area of semiconductor material is increased, the need for obtaining semiconductor material having lower defect densities also increases. At the same time, the physical properties of the materials such as warpage and flatness must be held to stricter tolerances. Therefore, a gettering technique must not only provide a reliable increase in electrical properties by reducing the defect density but it must preserve the dimensional integrity of the material at the same time. This becomes more difficult when, for example, silicon wafers having a diameter of 3 inches or more are employed in the manufacture of integrated circuit devices. For example, back side lapping, front side polishing and a high temperature (1250° C.) anneal in an oxygen ambient has been used to improve the electrical characteristics of silicon wafers but severe warpage during processing has been found to occur. Also, the rough back side of the wafers is a potential trap for various processing fluids used in the device manufacturing process which can result in wafer contamination. A process has now been found which provides for the manufacture of semiconductor wafers which have improved electrical properties and which meet the dimensional requirements needed for high density device manufacture.

BRIEF SUMMARY OF THE INVENTION

In accordance with the invention a process for preparing a gettered semiconductor wafer is provided in which the wafer is shaped to form two flat parallel faces and the damage resulting from the shaping operation is removed. A layer of damage, having a depth of about 8-35 microns, is then ground in a first face using a rotating abrasive means. The wafer is heated, after grinding, in an inert atmosphere for a time and temperature sufficient to getter impurities and to relieve the stresses caused by the grinding and the wafer is quenched after heating. The wafer is polished on both faces to remove the cavities and form a smooth surface on the face into which the damaged layer was ground while retaining a layer of crystallographic damage adjacent to the face for gettering during device fabrication and to form a polished, substantially damage-free front face into which semiconductor devices are to be formed.

Also provided is an improved gettered semiconductor wafer having a polished substantially damage-free front face and a smooth back face which has a layer of mechanically produced crystallographic damage adjacent to the back face for gettering during device manufacture.

DETAILED DESCRIPTION

Figure 1:
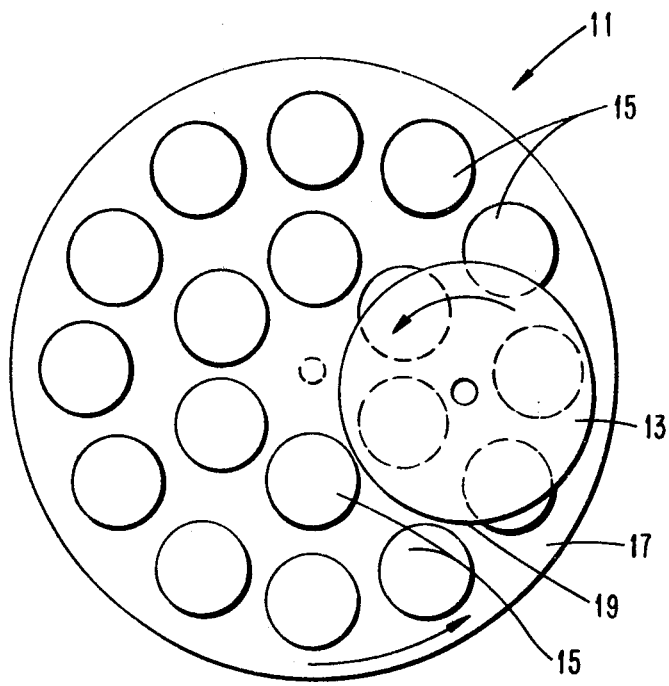
FIG. 1 is a highly schematic plan view of an apparatus suitable for forming the damage layer in the gettering process of the invention.
Figure 2:
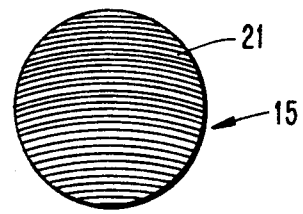
FIG. 2 is a plan view illustrating the damage pattern formed on the wafer.

The type of damage found effective in the process of the invention is that produced by a rotating abrasive means. An example of a suitable means is a Mueller grinder which is schematically illustrated in FIG. 1. The grinder 11 is conventionally used to remove damage from the crystal slicing operation and to provide a semiconductor wafer having flat parallel surfaces. The grinder has a rotating grinding wheel 13 which is of a much larger diameter than wafers 15. Wafers 15 are held stationary on rotating table 17 which carries the wafers under the wheel 13. In a preferred mode, grinding wheel 13 is tilted a few degrees from horizontal so that its leading edge 19 contacts wafers 15. The damage pattern produced on wafers 15 will vary somewhat, depending upon where each wafer is placed on table 17, but it is generally a series of slightly arcuate lines 21 as illustrated in FIG. 2. The height of wheel 13 above the surface of table 17 is adjusted in order to control the amount of material removed by each pass of wafers 15 under wheel 13. Usually a thickness of about 45 microns, or about 2 mils (0.002 inches), is removed during the grinding process which is carried out in stages so that progressively a smaller amount of material is removed at each stage with rough grinding removing 2 to 3 microns per pass, medium grinding 1 micron and fine grinding a half micron per pass. The rough grinding stage removes about 10 to 20 microns total, medium grinding removes about 15 to 20 microns total, and fine grinding and finishing the remainder. The table speed during rough grinding is about 5 to 10 rpm and fine grinding about 1 to 3 rpm. The grinding wheel speed is in the range of 1200 rpm. Water is used as a lubricant during the grinding process. The depth of damage is a function of the grit size of the grinding wheel. Grit sizes of 100 to 1200 of an abrasive material such as, for example, diamond, can be employed to produce damage depths of about 30 to 35 microns in the case of 100 grit down to about 5 to 10 microns in the case of 1200 grit. A preferred grit size is 400 which produces an average depth of damage of about 19 microns which can be readily polished to leave a smooth back surface having a residual layer of damage of 10–12 microns in depth.

In order to obtain the gettering effect of the invention, it is necessary to heat the wafers in an inert atmosphere prior to the initial oxidation. Heating temperatures of about 800° to 1150° C. can be employed. Suitable times range from about 1 to 4 hours. Times of under 1 hour may not produce a maximum benefit and times of more than 4 hours are unnecessary. Preferred heating conditions are about 1000° C. for about 3 hours. The heating also relieves stresses caused by the unsymmetrical damage pattern, so that the product wafers will not only meet initial warpage specifications but will not warp during processing. It is preferred to carry out the heating step prior to polishing as this avoids unnecessary handling of the polished wafer. Also, in the case of larger wafers, for example wafers which are 3 inches or more in diameter, it has been found that non-heat treated wafers have sufficient bow caused by the back side damage, even when small 1200 grit size is employed to produce the damaged layer, that a larger amount of material may be removed at the edges of the face of the wafer which protrude from the polishing nest. This causes the top surface to be beveled in from the edge of the wafer. This is unsuitable because it will cause the lithographic patterns around the edge of the wafer to be distorted during device processing and the beveled wafers, therefore, do not meet the flatness tolerances necessary for producing high density devices. Although this can be avoided by the use of a thicker than normal wafer nest, it is also believed that it can be avoided by the prepolishing heat treatment which relieves the bow caused by the unsymmetrical damaged pattern. In order to achieve the full gettering action, the wafers should be cooled or "quenched" prior to device processing down to less than about 600° C. This can be accomplished by removing the wafers from the furnace into the end cap of the furnace which is at a temperature of about 400° C. so that they quickly cool to below 600° C. in about 2–3 minutes.

The process of the invention produces a wafer which has a substantially damage-free front face in which the devices are to be formed. It also produces a smooth back surface which has a residual layer of lattice damage for gettering during device manufacture. This has the advantage of avoiding the trapping of contamination such as from handling equipment and processing solutions which can occur if the surface is rough and pitted. By smooth is meant an almost polished appearance which is substantially free of any visible cavities or pits. The gettering layer consists of a network of substantially linear dislocations terminating upon one another. The defect density is on the order of $1 \times 10^8$ to $1 \times 10^{10}$ per square centimeter. The network is confined to a plane parallel to and adjacent to the back surface of the wafer. Upon heat treatment the network remains confined to the plane adjacent to the back surface and does not propagate out of the plane.

The process can employ the so called free polishing process and apparatus which is described, for example, in IBM Technical Disclosure Bulletin by F. Goetz and J. Hause "Planetary 'Free' Wafer Polisher", Vol. 15, No. 6, pages 1760–1761, November 1972 or U.S. Pat. No. 3,691,694. A suitable polishing process is, for example, silica polishing. In the silica polishing process, a polishing slurry is used which includes a colloidal silicon dioxide abrasive, sodium dichloroisocyanurate as an oxidizing agent, and sodium carbonate as a base. The Ph of the polishing slurry is below 10. In the free polishing process, both sides of the wafer can be polished simultaneously or a wafer nest can be used which polishes only one side at a time as described, for example, in IBM Technical Disclosure Bulletin by T. B. Free "Single-Sided Free Polishing", Vol. 19, No. 12, page 4592 and IBM Technical Disclosure Bulletin by G. Markovits and E. Velky, "Free Polishing Apparatus", Vol. 19, No. 12, pages 4594–4595, May 1977. A two step process, in which the front surface is partially polished by single side polishing and then both surfaces are simultaneously polished by double side free polishing has been found to be advantageous to assure that the back side damage is not completely removed due to variations in the material removal rate which can occur in a production environment. Alternatively, the sides could each be polished separately. Other polishing apparatus and processes could be employed which produce a polished damage-free front side and a smooth back side with a residual layer of crystallographic damage which is sufficient to provide gettering during device processing.

The process of the invention is applied prior to device processing. In the production of silicon semiconductor wafers it is conveniently applied after the initial crystal slicing and wafer shaping operations. For example, wafers are sliced from a crystal and then ground in the Mueller grinder on both sides in order to produce a wafer having parallel faces. The grinding damage is then removed by etching in a so called "chem thinning" step. The wafers would then, conventionally, be polished. The gettering process can be started right after the chem thinning step so that it is compatible with the conventional wafer manufacturing process.

The invention is further illustrated by, but it is not intended to be limited to, the following examples.

EXAMPLE 1

Silicon semiconductor wafers 2 ohm centimeter P-type 3¼ inch in diameter were sliced from a crystal to give an initial wafer thickness of 26 ± 1 mils. The sliced wafer is then ground on both sides to produce a wafer having two flat parallel surfaces with a thickness of about 21 mils. The wafer edges are then chamfered to reduce edge friability and chem thinned to remove the grinding and chamfer damage to produce a wafer having a thickness of about 18 mils with two flat parallel surfaces. The foregoing is conventional. The chem thinned wafer is then placed in the Mueller grinder and the back side only is ground using a diamond grit size of 400 so as to produce a wafer with a thickness of about 16.5 mils and a back side damage depth of about 19 microns. The wafer is then heated for 3 hours at 1000° C. in a nitrogen atmosphere and is quickly withdrawn from the furnace to the furnace end cap temperature so that it rapidly cools below 600° C. This relieves the stresses from the unsymmetrical damage configuration and accomplishes the gettering of any impurities. The wafer is then placed in a free polishing apparatus with the front side only exposed to the polishing process and silica polished to produce a polished damage-free device face on the wafer which now has a thickness of about 16 ± 0.4 mils. The wafer is then placed in a wafer nest which exposes both surfaces to the free polishing process and both sides are simultaneously silica polished. This removes the rough surface topology from the back surface and eliminates cavities which are potential contaminate traps while leaving behind sufficient crystallographic damage to do additional gettering during the device processing. The polishing process removes about half of the damage layer which leaves a residual damage depth, when using a 400 grit wheel, of about 12 to 13 microns. If a 1200 grit wheel is used the residual damage depth would be about 2 to 3 microns. The final wafer thickness is 15.5 ± 0.5 mils. Sample wafers which were produced by the process of Example 1 were measured for warpage and flatness using a light interference technique in which the interference rings are counted. The wafer is in a condition in which its bottom face is pulled down on a vacuum chuck for the flatness measurement. The vacuum is released for the warpage measurement. The average flatness was 0.3 mil with a range of 0.24 to 0.42 mil with all the fringes being counted to the edge of the wafer. The average warpage was equal to 0.29 mil with a range of 0.24 to 0.30. Two groups of control wafers which were processed in accordance with Example 1, except that the heat treatment was eliminated, were roughly equivalent to the heat treated wafers in flatness, but the average warpage of the two groups of samples was high being 1.8 mils and 1.54 mils respectively. Ten sample wafers which were produced by the process of Example 1 were measured for their electrical properties and defect densities were determined. The wafers were oxidized and 120 aluminum dots which are each 60 mils in diameter were deposited on the front surface. Each dot was individually electrically tested and the defect density calculated from the results. The defect density ranged from 2 to 29 defects per cm$^2$ with an average of about 7 defects per cm$^2$. Twelve control wafers were double sided polished in a normal manner following chem thinning. Three wafers were total failures (>500 defects per cm$^2$). The other nine wafers gave defect densities of about 6 to about 190 defects per cm$^2$ with an average of over 70 defects per cm$^2$.

EXAMPLE 2

Chem thinned silicon semiconductor wafers, 10 to 20 ohm/cm P-type, 57 millimeters in diameter (type A) and 2 to 4 ohm/cm P-type, 57 millimeters in diameter (type B) were ground on the back side only with the Mueller grinding using diamond grit sizes of 400, 240, and 100, respectively to produce different depths of damage in different wafer samples. The samples were then silica polished on both sides to leave a residual back side damage layer of about 10 microns in depth. The resultant back side finish varied from an almost polished appearance for the 400 grit wheel to a heavily pitted surface with a 100 grit wheel. Control wafers were not damaged but were double side polished. The damaged wafers were treated in a furnace at 1000° C. in nitrogen for 3 hours and removed from the furnace to cool below 600° C. They were then reinserted along with the control wafers and oxidized to form an oxide layer of about 5000 Å in thickness. 120, 60 mil in diameter aluminum dots were deposited and tested. The results are shown in Tables I and II below where defect density was calculated from the electrical tests.

TABLE I

| Grinding Wheel | Type A Defects/cm$^2$ | | |
|---|---|---|---|
| | Sample | Backside Damaged Wafers | Controls |
| 400 Grit | 1 | 1 | 145 |
| | 2 | 1 | 78 |
| 240 Grit | 1 | 0 | 131 |
| | 2 | 1 | 105 |
| 100 Grit | 1 | 1 | 52 |
| | 2 | 2 | 60 |
| | | Avg. = 1 | Avg. = 95 |

TABLE II

| Grinding Wheel | Type B Defects/cm$^2$ | | |
|---|---|---|---|
| | Sample | Backside Damaged Wafers | Controls |
| 400 Grit | 1 | 1 | 24 |
| | 2 | 2 | 91 |
| 240 Grit | 1 | 2 | 9 |
| | 2 | 2 | 105 |
| 100 Grit | 1 | 0 | 52 |
| | 2 | 0 | 73 |
| | | Avg. = 1 | Avg. = 59 |

Sample wafers processed in the same way but using a 1 hour heat treatment gave a similar result with an average defect density of around 8.

EXAMPLE 3

Chem thinned silicon semiconductor wafers of Type A and B as described in Example 2 were back side damaged with a 400 grit diamond wheel in the Mueller grinder after chem thinning and then polished. Some of the samples were heated for 3 hours in nitrogen and quenched by removing them from the furnace. Other samples were oxidized without removal from the furnace with the temperature maintained at 1000° C. Other samples were tested which were not heated at all. In each case, controls were tested which did not have the back side damage layer. The defect density results are shown in Table III below.

TABLE III

| | Defects/cm$^2$ (Range) | |
|---|---|---|
| Process | Type A | Type B |
| Damage, heat, quench | 1–10 | 4–5 |
| heat, quench | 25–91 | 14–50 |
| Damage, heat, no quench | 6–8 | 11–14 |
| heat, no quench | 10–27 | 7–9 |
| Damage only | 50–>500 | — |
| Untreated | 79 | 16–22 |

It can be seen from Table III that the damaged, heated and quenched wafers gave improved results compared with the various control wafers.

The foregoing has described a process for obtaining semiconductor wafers having improved electrical properties which are produced by a process compatible with normal wafer production using standard equipment. The wafers meet rigid dimensional specifications and have a residual layer of damage for gettering during device processing.

While the foregoing invention has been particularly shown and described with reference to preferred embodiments thereof, it will be understood by those skilled in the art that various changes in form and details may be made therein without departing from the spirit and scope of the invention.

We claim:

1. A process for preparing a gettered semiconductor wafer comprising:
   (1) shaping the wafer to form two flat parallel faces and removing damage resulting from said shaping,
   (2) grinding a layer of damage having a depth of about 8–35 microns in a first face with a rotating abrasive means,
   (3) heating the wafer in an inert atmosphere for a time and temperature sufficient to getter impurities and to relieve stresses caused by said grinding and quenching said wafer after heating and,
   (4) polishing said faces to form a smooth surface on the first face, while retaining a layer of crystallographic damage adjacent said face, and to form a polished substantially damage-free second face.

2. The process of claim 1 wherein the semiconductor is silicon.

3. The process of claim 1 wherein the abrasive means is diamond having a grit size ranging from about 100 to 1200.

4. The process of claim 1 wherein the heating step occurs after grinding and before polishing.

5. The process of claim 1 wherein the heating step is in a furnace at a temperature of about 800° to 1150° C. for a time of about 1 to 4 hours in a nitrogen atmosphere and the wafer is quenched by removing the wafer to a lower temperature so that it cools to below about 600° C. prior to further processing.

6. The process of claim 1 wherein the polishing is free polishing with silica.

7. The process of claim 1 wherein the layer of crystallographic damage consists of a network of substantially linear dislocations terminating upon one another having a defect density of from about $1 \times 10^8$ to $1 \times 10^{10}$ per $cm^2$ with the network being confined to a plane parallel to the first face.

8. The process of claim 6 wherein the polishing is performed in two stages in which the second face is single side polished to form a polished, substantially defect surface and then the first and second faces are simultaneously polished such that the second face has a residual layer of crystallographic damage having a depth of about 10–12 microns.

9. The process of claim 1 wherein the heating step occurs after grinding and polishing.

10. A process for making a high performance silicon semiconductor wafer with built in gettering prior to device fabrication comprising the steps of:
  (1) shaping the wafer to form two flat parallel surfaces,
  (2) chemically treating the wafer to remove damage resulting from said shaping,
  (3) grinding a layer of damage having a depth of about 8–35 microns in only one of said surfaces with a rotating abrasive means,
  (4) heating the wafer, after grinding in an inert atmosphere from a time and temperature sufficient to getter impurities and relieve stresses caused by said grinding and quenching said wafer after heating,
  (5) polishing only the other surface after said heating and quenching and
  (6) simultaneously free polishing both surfaces to remove cavities from the damaged surface while retaining a residual layer of crystallographic damage for gettering during device fabrication.

11. The process of claim 10 wherein the rotating abrasive means is a 400 grit diamond wheel and the heating is in a nitrogen atmosphere at about 1000° C. for about 3 hours and the residual layer damage depth is from about 10 to 12 microns.

12. A gettered semiconductor wafer having a polished substantially damage-free front surface and a smooth back surface which has a layer of mechanically produced crystallographic damage adjacent to the back surface for gettering during device processing wherein said damage consists of a network of substantially linear dislocations terminating upon one another having a defect density of from about $1 \times 10^8$ to $1 \times 10^{10}$ per $cm^2$ with the network being confined to a plane parallel to the back surface.

* * * * *